(12) United States Patent
Yeh et al.

(10) Patent No.: US 9,245,805 B2
(45) Date of Patent: Jan. 26, 2016

(54) GERMANIUM FINFETS WITH METAL GATES AND STRESSORS

(75) Inventors: Chih Chieh Yeh, Taipei (TW); Chih-Sheng Chang, Hsin-Chu (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 448 days.

(21) Appl. No.: 12/831,903

(22) Filed: Jul. 7, 2010

(65) Prior Publication Data

US 2011/0068407 A1 Mar. 24, 2011

Related U.S. Application Data

(60) Provisional application No. 61/245,547, filed on Sep. 24, 2009.

(51) Int. Cl.
| | |
|---|---|
| *H01L 21/70* | (2006.01) |
| *H01L 27/088* | (2006.01) |
| *H01L 29/78* | (2006.01) |
| *H01L 29/20* | (2006.01) |
| *H01L 21/02* | (2006.01) |
| *H01L 29/06* | (2006.01) |
| *H01L 21/8238* | (2006.01) |
| *H01L 29/66* | (2006.01) |

(52) U.S. Cl.
CPC ...... *H01L 21/823821* (2013.01); *H01L 21/823807* (2013.01); *H01L 21/823814* (2013.01); *H01L 29/6681* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,310,367 B1 * | 10/2001 | Yagishita et al. | 257/190 |
| 6,706,571 B1 | 3/2004 | Yu et al. | |
| 6,858,478 B2 * | 2/2005 | Chau et al. | 438/149 |
| 7,190,050 B2 | 3/2007 | King et al. | |
| 7,247,887 B2 | 7/2007 | King et al. | |

(Continued)

FOREIGN PATENT DOCUMENTS

| | | |
|---|---|---|
| JP | 2003224268 A | 8/2003 |
| JP | 2007258485 | 10/2007 |

(Continued)

OTHER PUBLICATIONS

Gordon K. Teal. Single Crystals of Germanium and Silicon—Basic to the Transistor and Integrated Circuit. Jul. 1976. IEEE Transactions on Electron Devices. vol. 23, No. 7. pp. 621-639.*

(Continued)

*Primary Examiner* — Hoang-Quan Ho
(74) *Attorney, Agent, or Firm* — Slater & Matsil, L.L.P.

(57) ABSTRACT

An integrated circuit structure includes an n-type fin field effect transistor (FinFET) and a p-type FinFET. The n-type FinFET includes a first germanium fin over a substrate; a first gate dielectric on a top surface and sidewalls of the first germanium fin; and a first gate electrode on the first gate dielectric. The p-type FinFET includes a second germanium fin over the substrate; a second gate dielectric on a top surface and sidewalls of the second germanium fin; and a second gate electrode on the second gate dielectric. The first gate electrode and the second gate electrode are formed of a same material having a work function close to an intrinsic energy level of germanium.

19 Claims, 13 Drawing Sheets

(56) References Cited

U.S. PATENT DOCUMENTS

| | | | |
|---|---|---|---|
| 7,265,008 B2 | 9/2007 | King et al. | |
| 7,508,031 B2 | 3/2009 | Liu et al. | |
| 7,525,160 B2 | 4/2009 | Kavalieros et al. | |
| 7,528,465 B2 | 5/2009 | King et al. | |
| 7,544,551 B2 | 6/2009 | Streck et al. | |
| 7,605,449 B2 | 10/2009 | Liu et al. | |
| 7,629,658 B2 | 12/2009 | Sugiyama et al. | |
| 7,687,339 B1* | 3/2010 | Schultz et al. | 438/197 |
| 7,723,797 B2 | 5/2010 | Kim et al. | |
| 7,800,140 B2 | 9/2010 | Nakanishi et al. | |
| 7,825,481 B2* | 11/2010 | Chau et al. | 257/401 |
| 7,939,447 B2* | 5/2011 | Bauer et al. | 438/680 |
| 7,960,793 B2 | 6/2011 | Shimizu et al. | |
| 7,968,952 B2* | 6/2011 | Fischer et al. | 257/401 |
| 8,102,004 B2 | 1/2012 | Nagatomo | |
| 8,154,082 B2 | 4/2012 | Moriyama et al. | |
| 8,216,906 B2* | 7/2012 | Tsai et al. | 438/304 |
| 8,236,659 B2* | 8/2012 | Tsai et al. | 438/300 |
| 2004/0036127 A1* | 2/2004 | Chau et al. | 257/401 |
| 2005/0070122 A1* | 3/2005 | Gousev et al. | 438/765 |
| 2005/0082624 A1* | 4/2005 | Gousev et al. | 257/410 |
| 2005/0153490 A1 | 7/2005 | Yoon et al. | |
| 2006/0022268 A1 | 2/2006 | Oh et al. | |
| 2006/0138552 A1* | 6/2006 | Brask et al. | 257/369 |
| 2007/0069302 A1* | 3/2007 | Jin et al. | 257/369 |
| 2007/0090416 A1* | 4/2007 | Doyle et al. | 257/288 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0221956 A1 | 9/2007 | Inaba | |
| 2007/0235819 A1* | 10/2007 | Yagishita | 257/401 |
| 2007/0249115 A1* | 10/2007 | Luk et al. | 438/238 |
| 2008/0050918 A1* | 2/2008 | Damlencourt | 438/694 |
| 2008/0157208 A1* | 7/2008 | Fischer et al. | 257/368 |
| 2008/0290470 A1 | 11/2008 | King et al. | |
| 2008/0296632 A1 | 12/2008 | Moroz et al. | |
| 2009/0039418 A1* | 2/2009 | Min et al. | 257/327 |
| 2009/0065853 A1 | 3/2009 | Hanafi | |
| 2009/0111246 A1* | 4/2009 | Bauer et al. | 438/478 |
| 2009/0142897 A1* | 6/2009 | Chau et al. | 438/285 |
| 2009/0181477 A1 | 7/2009 | King et al. | |
| 2010/0127333 A1* | 5/2010 | Hou et al. | 257/368 |
| 2010/0144121 A1* | 6/2010 | Chang et al. | 438/478 |
| 2010/0163842 A1* | 7/2010 | Lai et al. | 257/19 |
| 2010/0264468 A1* | 10/2010 | Xu | 257/288 |
| 2011/0018065 A1* | 1/2011 | Curatola et al. | 257/368 |
| 2011/0042729 A1* | 2/2011 | Chen et al. | 257/288 |
| 2011/0057267 A1* | 3/2011 | Chuang et al. | 257/380 |
| 2011/0117732 A1* | 5/2011 | Bauer et al. | 438/507 |
| 2011/0147840 A1* | 6/2011 | Cea et al. | 257/347 |
| 2011/0169083 A1* | 7/2011 | Yang et al. | 257/347 |
| 2011/0169084 A1* | 7/2011 | Yang et al. | 257/347 |
| 2011/0248348 A1* | 10/2011 | Gan et al. | 257/369 |
| 2011/0278676 A1* | 11/2011 | Cheng et al. | 257/369 |

FOREIGN PATENT DOCUMENTS

| | | |
|---|---|---|
| JP | 2008226901 A | 9/2008 |
| JP | 2008235350 | 10/2008 |
| JP | 2009018492 A | 1/2009 |
| JP | 2009060104 A | 3/2009 |
| JP | 2009514248 A | 4/2009 |
| JP | 2009517867 A | 4/2009 |
| JP | 2009105155 A | 5/2009 |
| JP | 2009194068 A | 8/2009 |
| JP | 2009200118 | 9/2009 |
| JP | 2010177451 A | 8/2010 |
| KR | 10-2006-0031676 A | 4/2006 |
| KR | 100618852 B1 | 9/2006 |
| WO | WO 2005/004206 A2 | 1/2005 |

OTHER PUBLICATIONS

Skotnicki, T., "Which junction for advanced CMOS?—theory, benchmark and predictions," Ext. Abs. the 5th International Workshop on Junction Technology 2005, 3 pgs., STMicroelectronics, Crolles, France.

Sun, Y. et al., "Physics of strain effects in semiconductors and metal-oxide-semiconductor field-effect transistors," Journal of Applied Physics 101, published online May 18, 2007, 22 pgs., American Institute of Physics.

* cited by examiner

GERMANIUM FINFETS WITH METAL GATES AND STRESSORS

This application claims the benefit of U.S. Provisional Application No. 61/245,547 filed on Sep. 24, 2009, entitled "Germanium FinFETs with Metal Gates and Stressors," which application is hereby incorporated herein by reference.

TECHNICAL FIELD

This application relates generally to integrated circuit structures, and more particularly to the structures of fin field effect transistors (FinFETs) and the methods of forming the same.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Germanium is a commonly known semiconductor material. The electron mobility and hole mobility of germanium are greater (2.6 times and 4 times, respectively) than that of silicon, which is the most commonly used semiconductor material in the formation of integrated circuits. Hence, germanium is an excellent material for forming integrated circuits. An additional advantageous feature of germanium is that germanium's hole and electron motilities have a greater stress sensitivity than that of silicon. For example, FIG. 1 illustrates the hole mobility of germanium and silicon as a function of uni-axial compressive stresses. It is noted that with the increase in the compressive stress, the hole mobility of germanium increases at a faster rate than silicon, indicating that germanium-based PMOS devices have a greater potential to have high drive currents than silicon-based PMOS devices. Similarly, FIG. 2 illustrates the electron mobility of germanium and silicon as functions of uni-axial tensile stresses. It is noted that with the increase in the tensile stress, the electron mobility of germanium increases at a faster rate than that of silicon, indicating that germanium-based NMOS devices have a greater potential to have high drive currents than silicon-based NMOS devices.

Germanium, however, also suffers from drawbacks. The bandgap of germanium is 0.66 eV, which is smaller than the bandgap of silicon (1.12 eV). This means that the substrate leakage currents of germanium-based MOS devices are high. In addition, the dielectric constant of germanium is 16, and is greater than the dielectric constant of silicon (11.9). Accordingly, the drain-induced barrier lowering (DIBL) of germanium-based MOS devices is also higher than that of silicon-based MOS devices.

SUMMARY

In accordance with one aspect of the embodiment, an integrated circuit structure includes an n-type fin field effect transistor (FinFET) and a p-type FinFET. The n-type FinFET includes a first germanium fin over a substrate; a first gate dielectric on a top surface and sidewalls of the first germanium fin; and a first gate electrode on the first gate dielectric. The p-type FinFET includes a second germanium fin over the substrate; a second gate dielectric on a top surface and sidewalls of the second germanium fin; and a second gate electrode on the second gate dielectric. The first gate electrode and the second gate electrode are formed of a same material having a work function close to an intrinsic energy level of germanium.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel fin field-effect transistor (FinFET) embodiment and the method of forming the same are presented. The intermediate stages of manufacturing the embodiment are illustrated. The variations of the embodiment are discussed. Throughout the various views and illustrative embodiments, like reference numbers are used to designate like elements.

Figure 1:
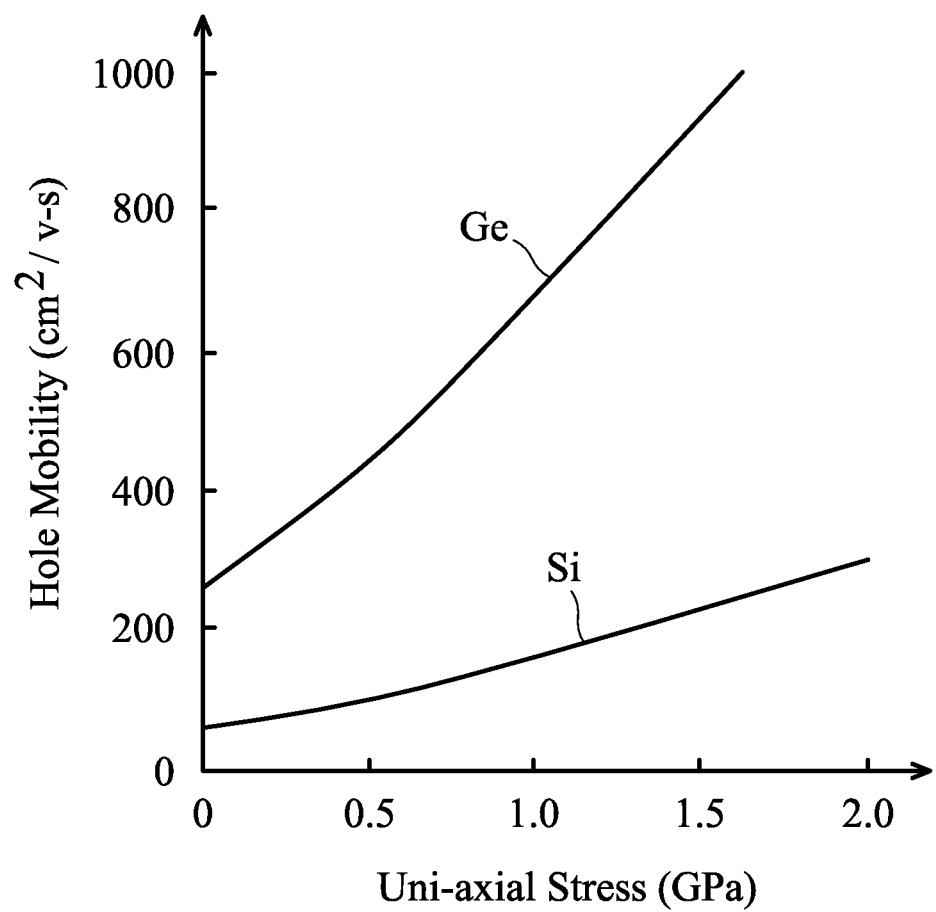
FIG. 1 illustrates the hole mobilities of germanium and silicon as functions of uni-axial compressive stresses.
Figure 2:
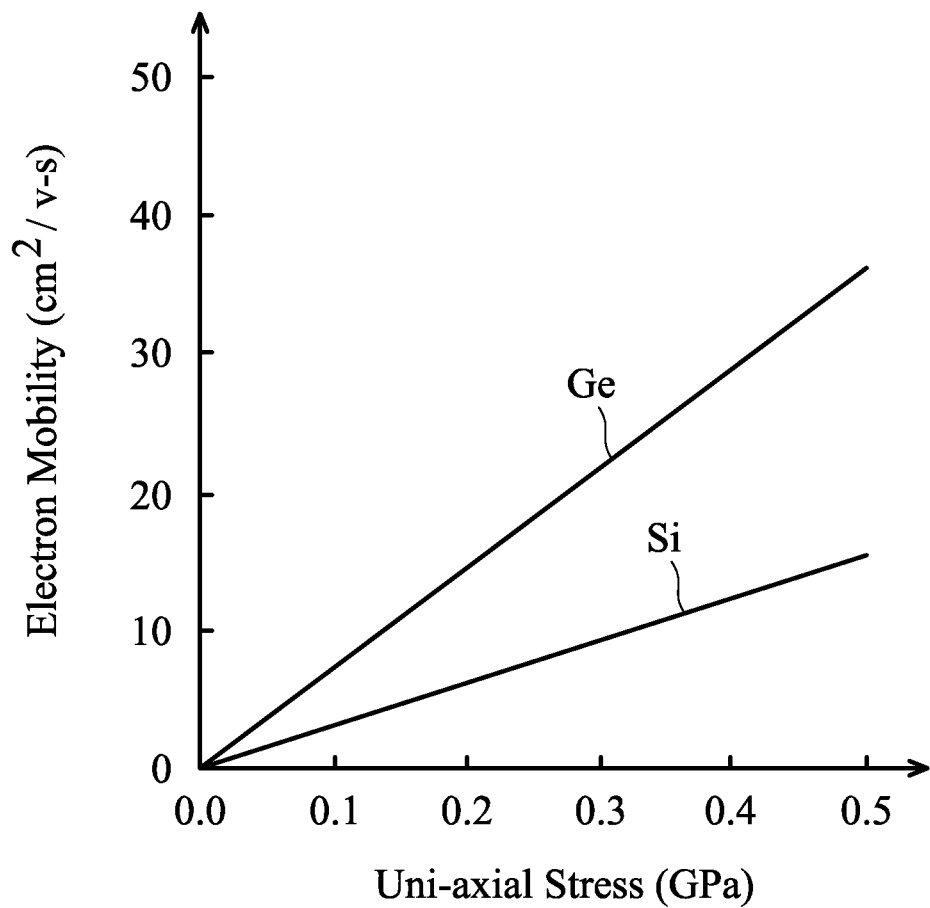
FIG. 2 illustrates the electron mobilities of germanium and silicon as functions of uni-axial tensile stresses.
Figure 3:
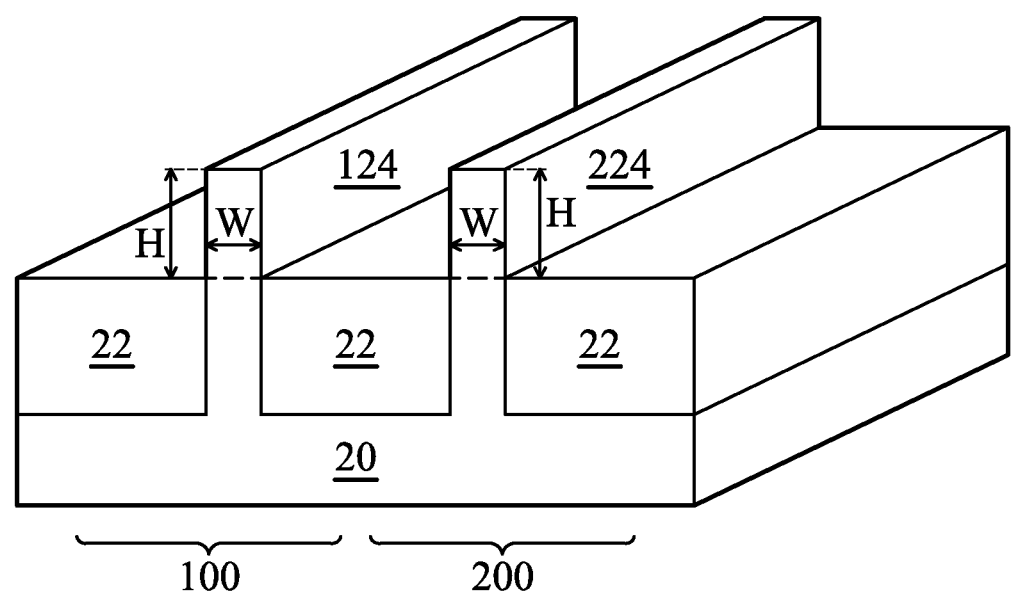
FIGS. 3 through 9 are perspective views and cross-sectional views of intermediate stages in the manufacturing of germanium-based FinFETs in accordance with an embodiment.

Referring to FIG. 3, an integrated circuit structure is formed. The integrated circuit structure includes substrate 20, which may be a silicon substrate, a germanium substrate, or a substrate formed of other semiconductor materials. Substrate 20 may be doped with a p-type or an n-type impurity. Isolation regions such as shallow trench isolation (STI) regions 22 may be formed in or over substrate 20. Germanium fins 124 and 224 are formed above the top surfaces of STI regions 22. In an exemplary embodiment, germanium fins 124 and 224 are formed by recessing top portions of substrate 20 between neighboring STI regions 22 to form recesses, and re-growing germanium in the recesses. Top portions of STI regions 22 may then be removed, while bottom portions of STI regions 22 are not removed, so that the top portion of the re-grown germanium between neighboring STI regions 22 becomes germanium fins. Germanium fins 124 and 224 may have a germanium atomic percentage greater than about 50 percent, for example. In an embodiment, fins 124 and 224 are formed of pure germanium. In alternative embodiments, fins 124 and 224 are formed of silicon germanium.

Germanium fins 124 and 224 may have channel dopings. Germanium fin 124 may be doped with a p-type impurity such as boron, while germanium fin 224 may be doped with an n-type impurity such as phosphorous. The channel doping of germanium fins 124 and 224 may be lower than about 5E17/$cm^3$, or as low as about 1E17/$cm^3$. In an exemplary embodiment, the aspect ratios of germanium fins 124 and 224 (the ratio of heights H to widths W), may be greater than about 1, or even greater than about 5. Substrate 20 includes a portion in NMOS device region 100 and a portion in PMOS device region 200. Germanium fins 124 and 224 are in NMOS device region 100 and PMOS device region 200, respectively.

Figure 4:
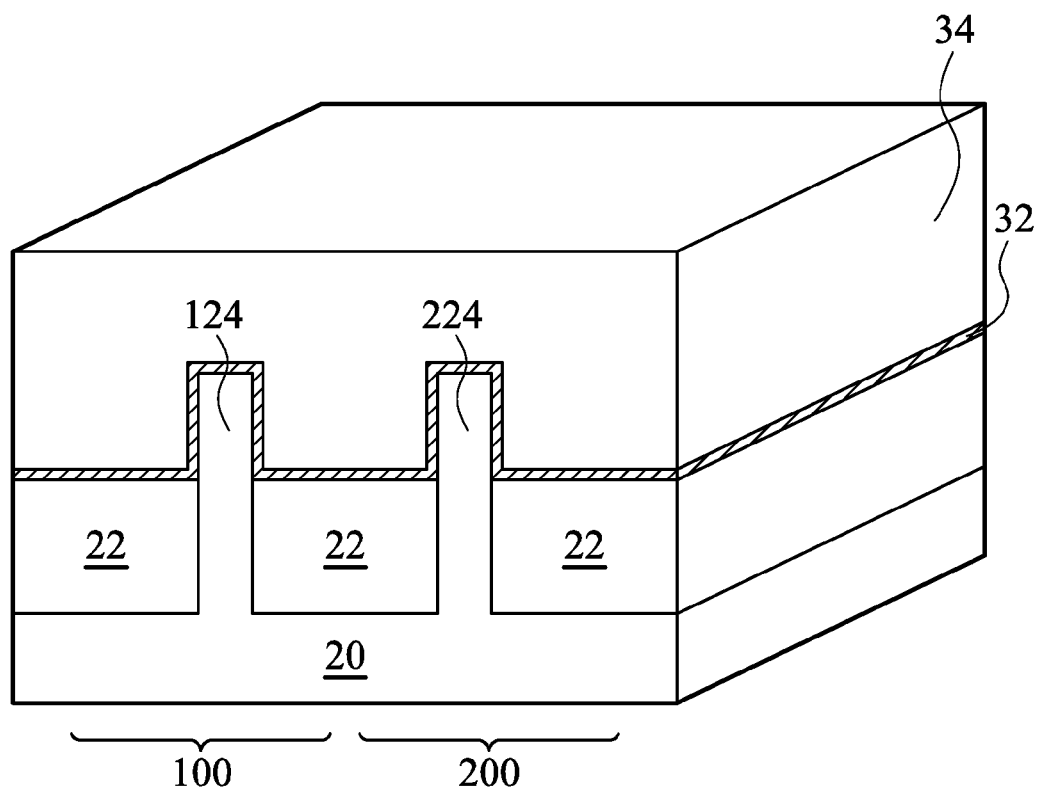

Referring to FIG. 4, gate dielectric layer 32 and gate electrode layer 34 are deposited in both NMOS device region 100 and PMOS device region 200 and over germanium fins 124 and 224. In an embodiment, gate dielectric layer 32 is formed of a high-k dielectric material. The exemplary high-k materials may have k values greater than about 4.0, or even greater than about 7.0, and may include aluminum-containing dielectrics such as $Al_2O_3$, HfAlO, HfAlON, AlZrO, Hf-containing materials such as $HfO_2$, $HfSiO_x$, $HfAlO_x$, $HfZrSiO_x$, HfSiON, and/or other materials such as $LaAlO_3$ and $ZrO_2$.

Gate electrode layer 34 is formed on gate dielectric layer 32, and may comprise metal. Gate electrode layer 34 may have a work function close to an intrinsic level (a middle level, which is about 4.33 eV) of the conduction band of germanium (4 eV) and the valance band of germanium (4.66 eV). In an embodiment, the work function of gate electrode layer 34 is between about 4.15 eV and about 4.5 eV, or even between about 4.25 eV and about 4.4 eV. Exemplary materials of gate electrode layer 34 include $Ti_xN_y$, $Ta_xN_y$, Al, $Ta_xC_y$, Pt, multi-layers thereof, and combinations thereof, with x and y being positive values.

Figure 5:
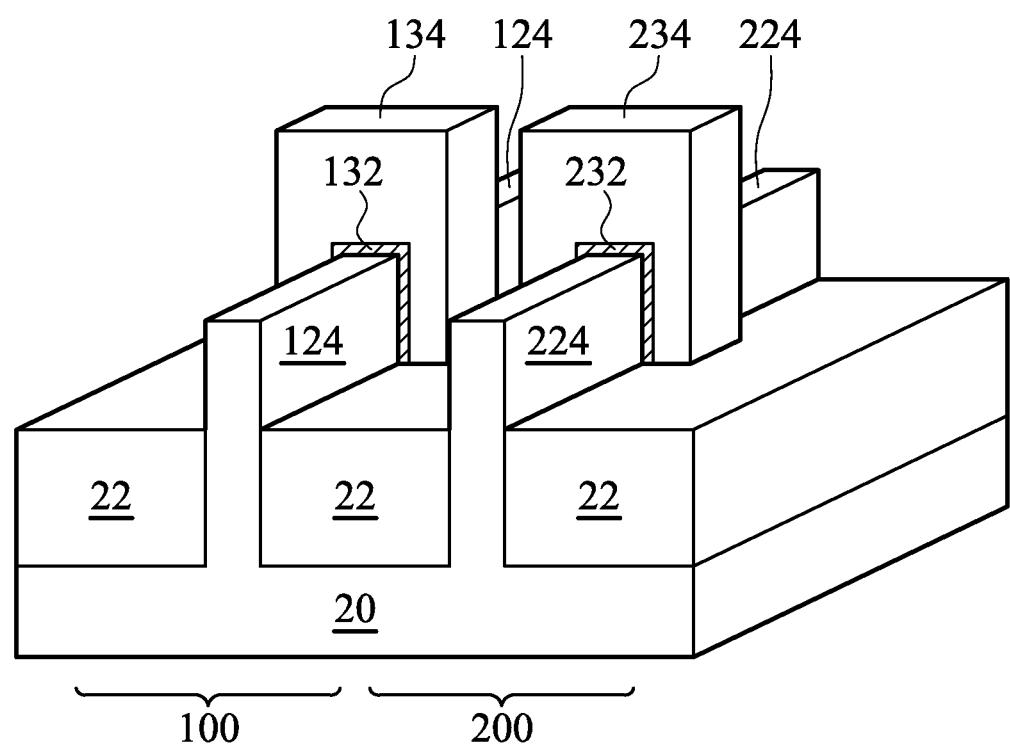

Gate electrode layer 34 and gate dielectric layer 32 are then patterned to form gate stacks, as is shown in FIG. 5. The gate stack in NMOS device region 100 includes gate electrode 134 and gate dielectric 132. The gate stack in PMOS device region 200 includes gate electrode 234 and gate dielectric 232. Each of germanium fins 124 and 224 thus has portions that are uncovered by the gate stacks.

Figure 6:
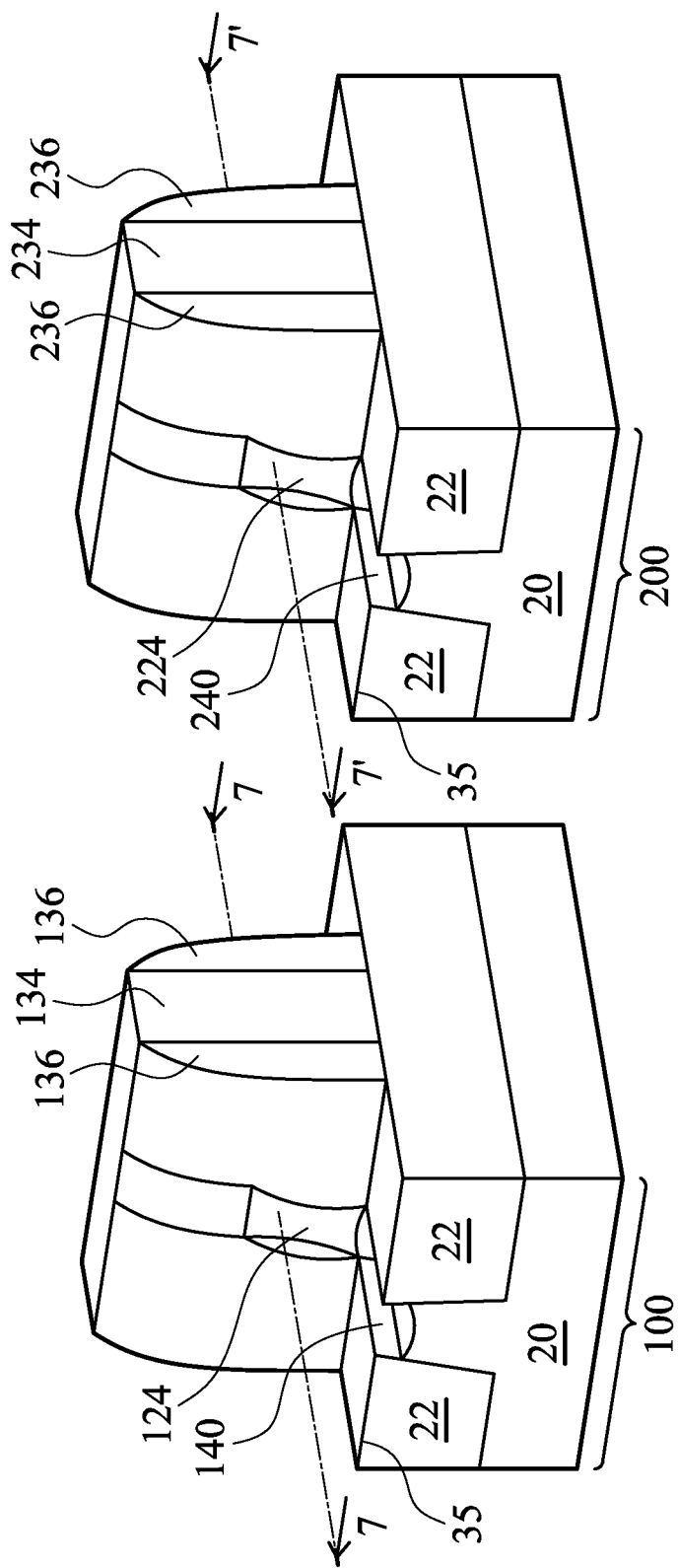

Referring to FIG. 6, gate spacers 136 and 236 may be formed. The exposed portions of germanium fins 124 and 224 not covered by gate dielectrics 132 and 232, gate electrodes 134 and 234, and gate spacers 136 and 236 are then removed (recessed), while the covered portion of germanium fins 124 and 224 are not removed. The removal may be performed by a dry etch. The spaces left by the removed portions of fins 124 and 224 are referred to as recesses 140 and 240, respectively, hereinafter. Recesses 140 and 240 may have bottoms level with top surfaces 35 of STI regions 22. Alternatively, the bottoms of recesses 140 and 240 may be lower than top surfaces 35 of STI regions 22, as illustrated in FIG. 6.

Figure 7:
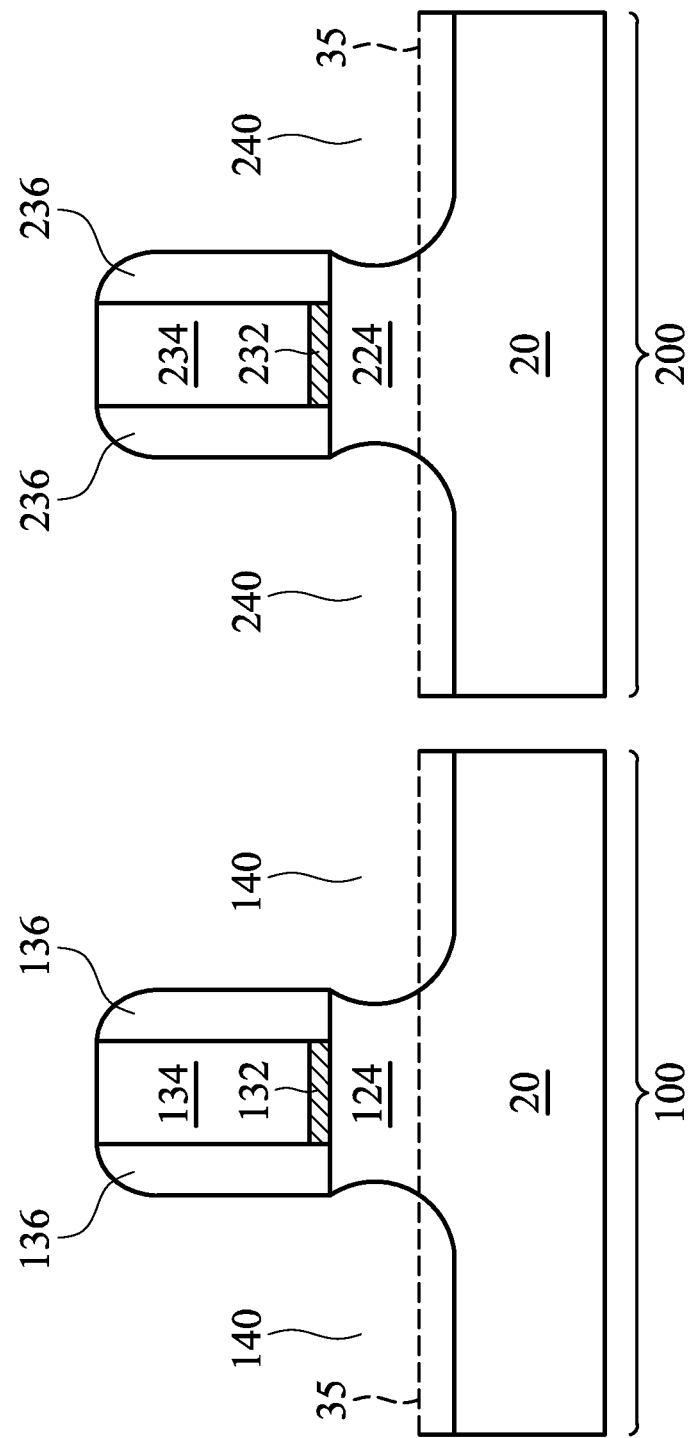

FIG. 7 (and subsequent FIGS. 8 and 9) illustrates a cross-sectional view of the structure shown in FIG. 6, wherein the cross-sectional view of NMOS device region 100 is obtained in a vertical plane crossing line 7-7 in FIG. 6, while the cross-sectional view of PMOS device region 200 is obtained in a vertical plane crossing line 7'-7' in FIG. 6. It is noted that although FIG. 7 and subsequent FIGS. 8 and 9 illustrate that the cross-sectional views of NMOS device region 100 and PMOS devices 200 are in a same plane, they may actually be in different planes.

Figure 8:
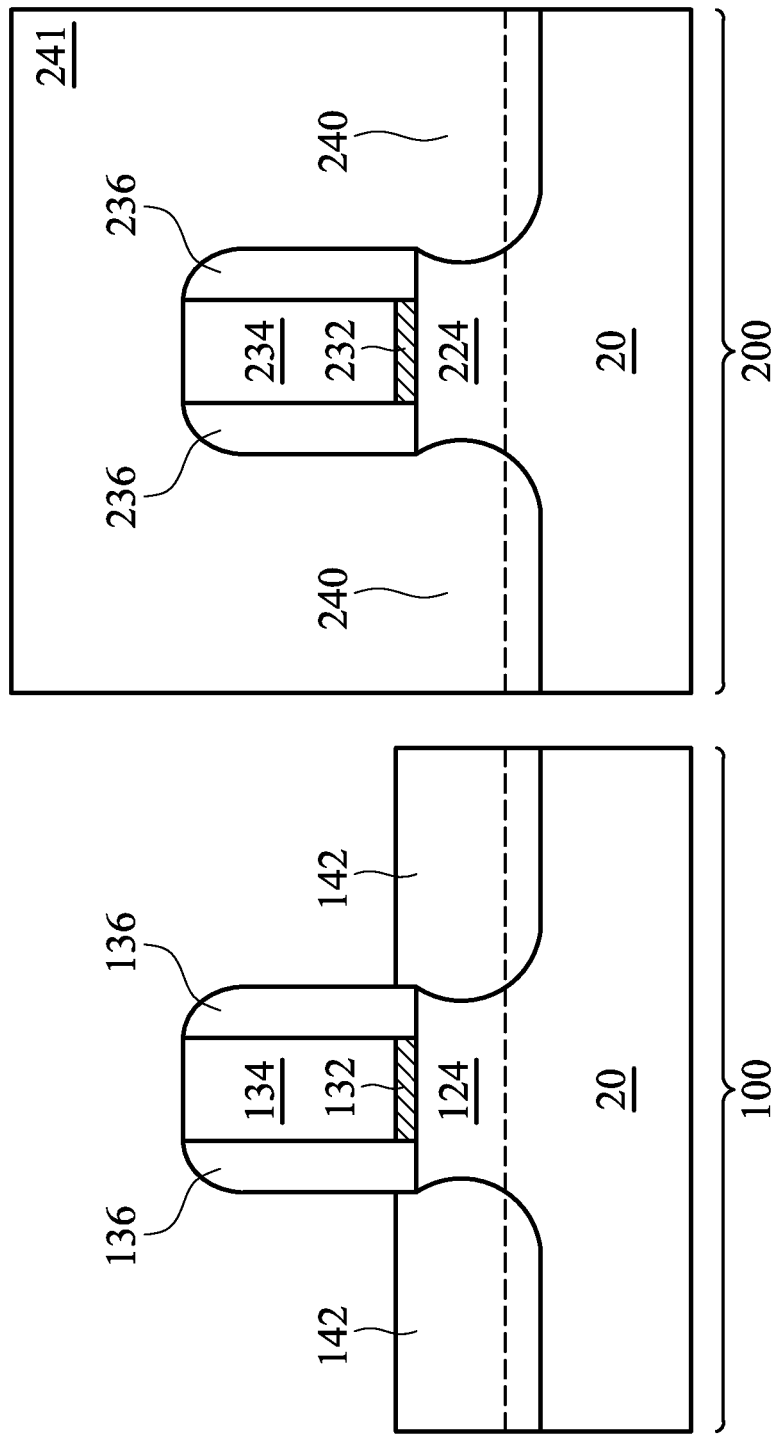

Next, as shown in FIG. 8, PMOS region 200 is covered, for example, by photo resist 241, and source and drain (referred to as source/drain hereinafter) regions 142 are epitaxially grown in recesses 140 by selective epitaxial growth (SEG). Source/drain regions 142 are also alternatively referred to as source/drain stressors 142, and may have a lattice constant smaller than the lattice constant of germanium fin 124. In an exemplary embodiment, source/drain regions 142 comprise SiGe, and are formed using plasma enhanced chemical vapor deposition (PECVD), or other commonly used methods. The precursors may include Si-containing gases such as $SiH_4$ and Ge-containing gases such as $GeH_4$, and the partial pressures of the Si-containing gases and Ge-containing gases are adjusted to modify the atomic ratio of germanium to silicon. In an embodiment, the resulting source/drain regions 142 include between about 20 and about 60 atomic percent silicon. In alternative embodiments, source/drain region 142 may be formed of silicon carbon (SiC) or silicon with no carbon and/or germanium added. N-type impurities, such as phosphorous and/or arsenic, may be in-situ doped when the epitaxial growth proceeds. With the lattice constant of source/drain region 142 being smaller than that of germanium fin 124, source/drain regions 142 apply a tensile stress to germanium fin 124, which forms the channel region of the resulting n-type FinFET 150. After the epitaxial growth of source/drain regions 142, photo resistor 241 is removed.

Figure 9:
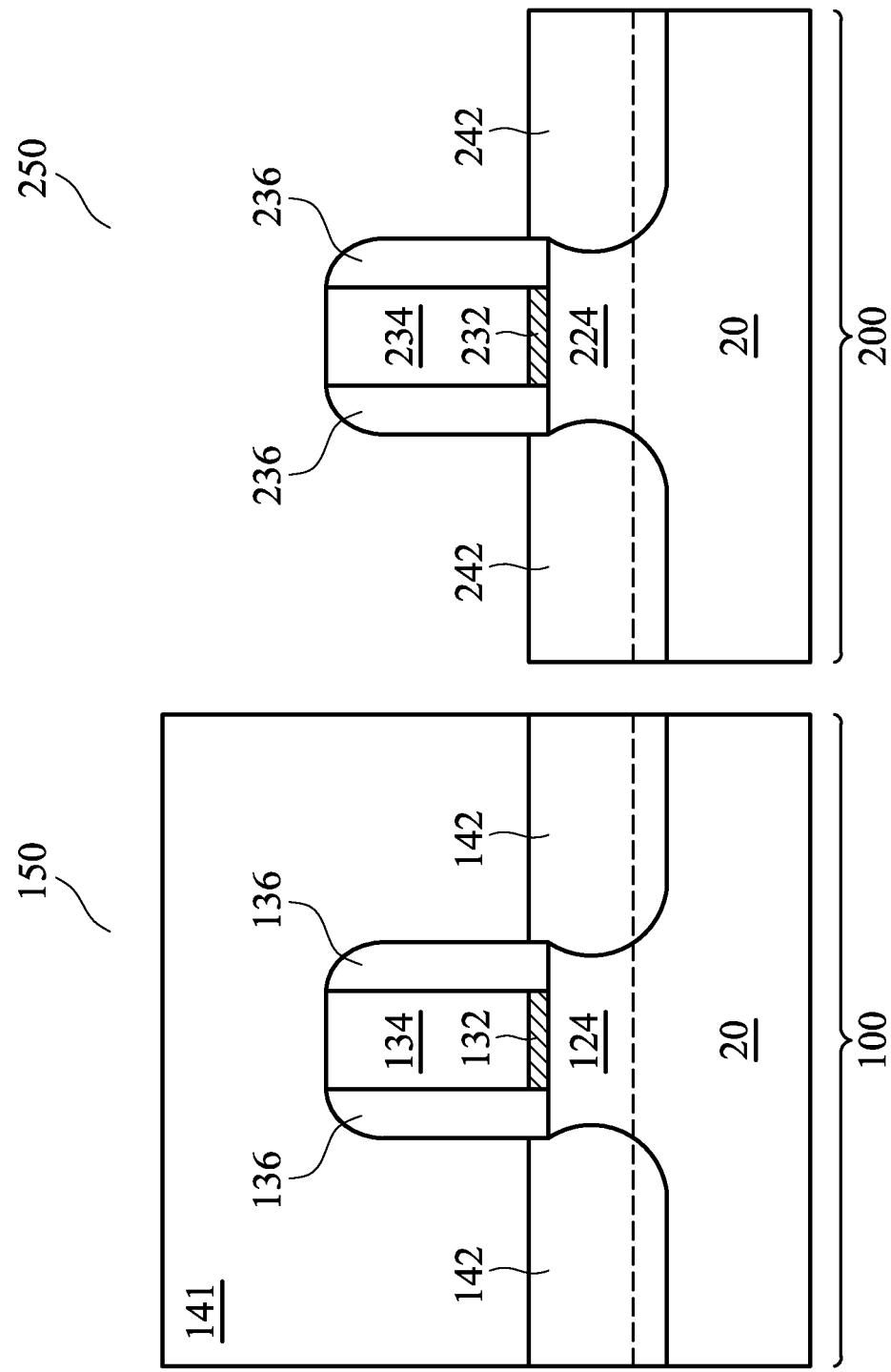

Referring to FIG. 9, NMOS device region 100 is covered, for example, by photo resist 141. Source/drains regions 242, which may also be referred to as a source/drain stressors 242, are epitaxially grown in recesses 240. Source/drain regions 242 may have a lattice constant greater than the lattice constant of germanium fin 224. Again, source/drain regions 242 may be formed using PECVD. In an embodiment, source/drain regions 242 comprise GeSn. In alternative embodiments, source/drain region 242 may be formed of compound semiconductor materials comprising group III and group V materials (referred to as III-V semiconductor materials hereinafter), such as InGaAs, InP, GaSb, InAs, AlSb, InSb, and the like. With the lattice constant of source/drain region 242 being greater than that of germanium fin 224, source/drain regions 242 apply a compressive stress to germanium fin 224, which forms the channel region of the resulting PMOS FinFET 250. After the epitaxial growth of source/drain regions 242, photo resistor 141 is removed.

During the epitaxial process for forming source/drain regions 142 and 242, n-type impurities (such as phosphorous) and p-type impurities (such as boron), respectively, may be doped with the proceeding epitaxial processes. The impurity concentration may be between about $5 \times 10^{20}/cm^3$ and about $1 \times 10^{21}/cm^3$. In alternative embodiments, no p-type and n-type impurities are doped, while the doping of source/drain regions 142 and 242 are performed in implantation steps after the formation of source/drain regions 142 and 242.

Next, silicide/germanide regions (not shown) may be formed on source/drain regions 142 and 242 by reacting source/drain regions 142 and 242 with a metal(s) to reduce the contact resistances. The formation details of silicide/germanide regions are known in the art, and hence are not repeated herein. Through the above-discussed process steps, n-type FinFET 150 and PMOS FinFET 250 are formed.

Figure 10:
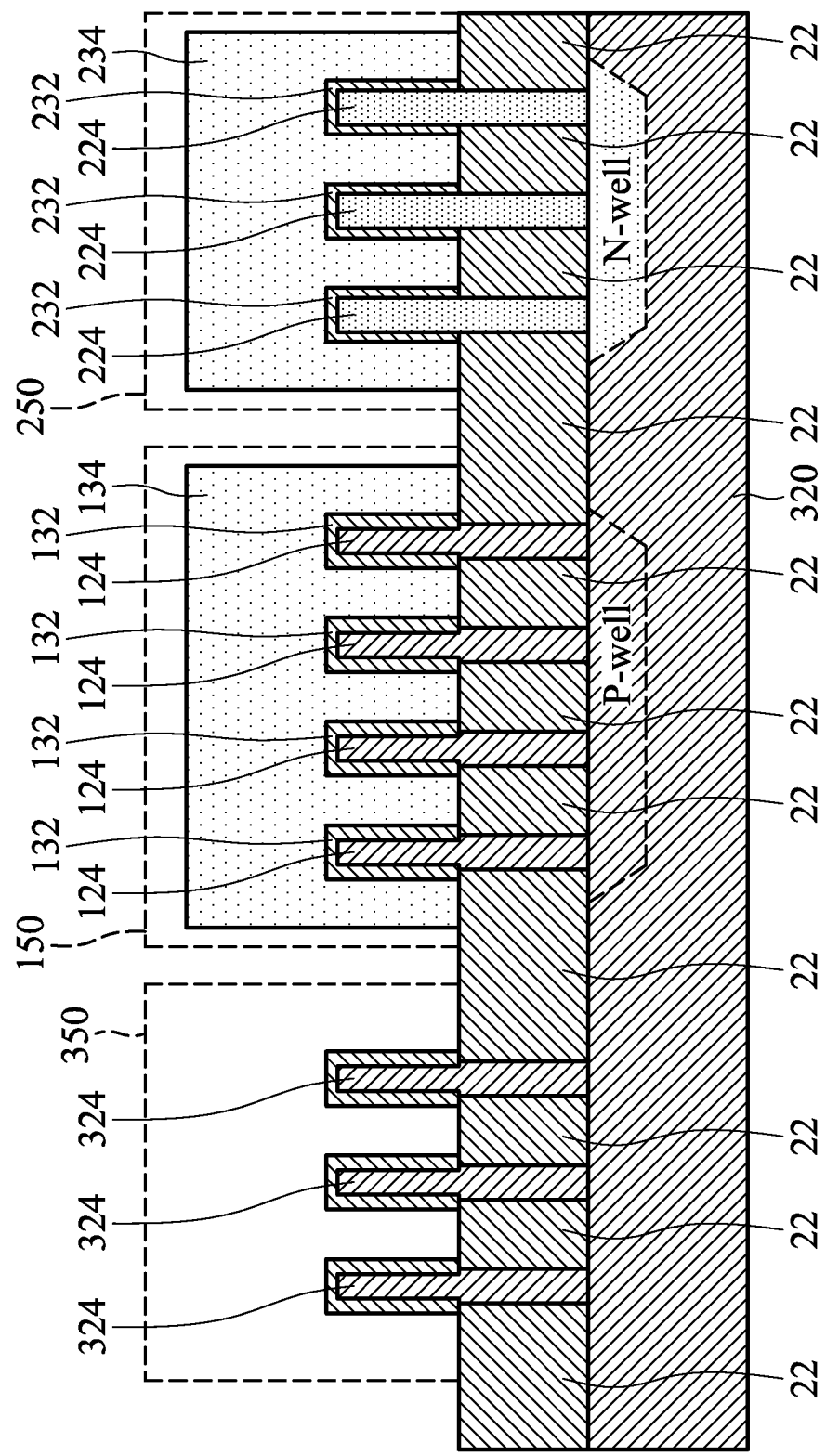
FIGS. 10-12 are perspective views and a cross-sectional view of multiple-fin FinFETs.
Figure 11:
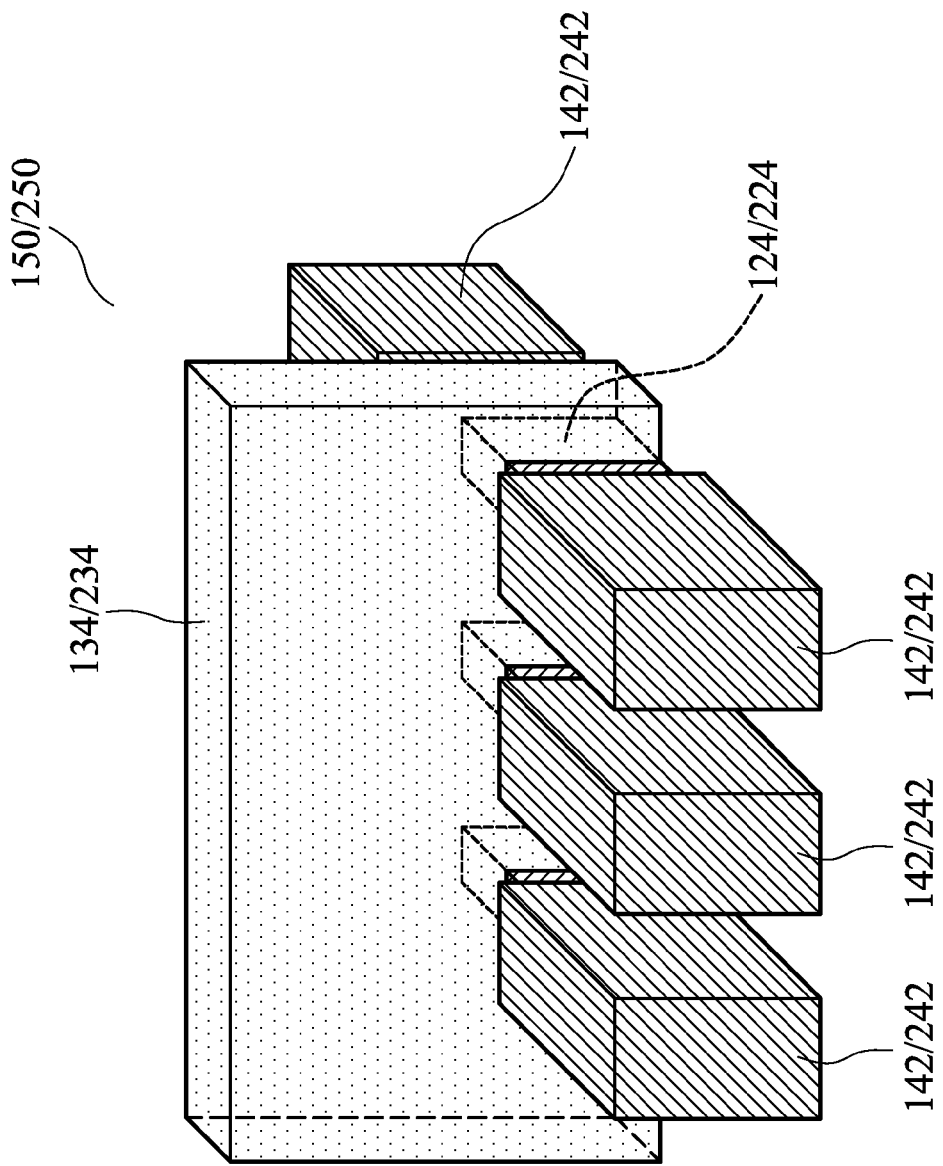
Figure 12:
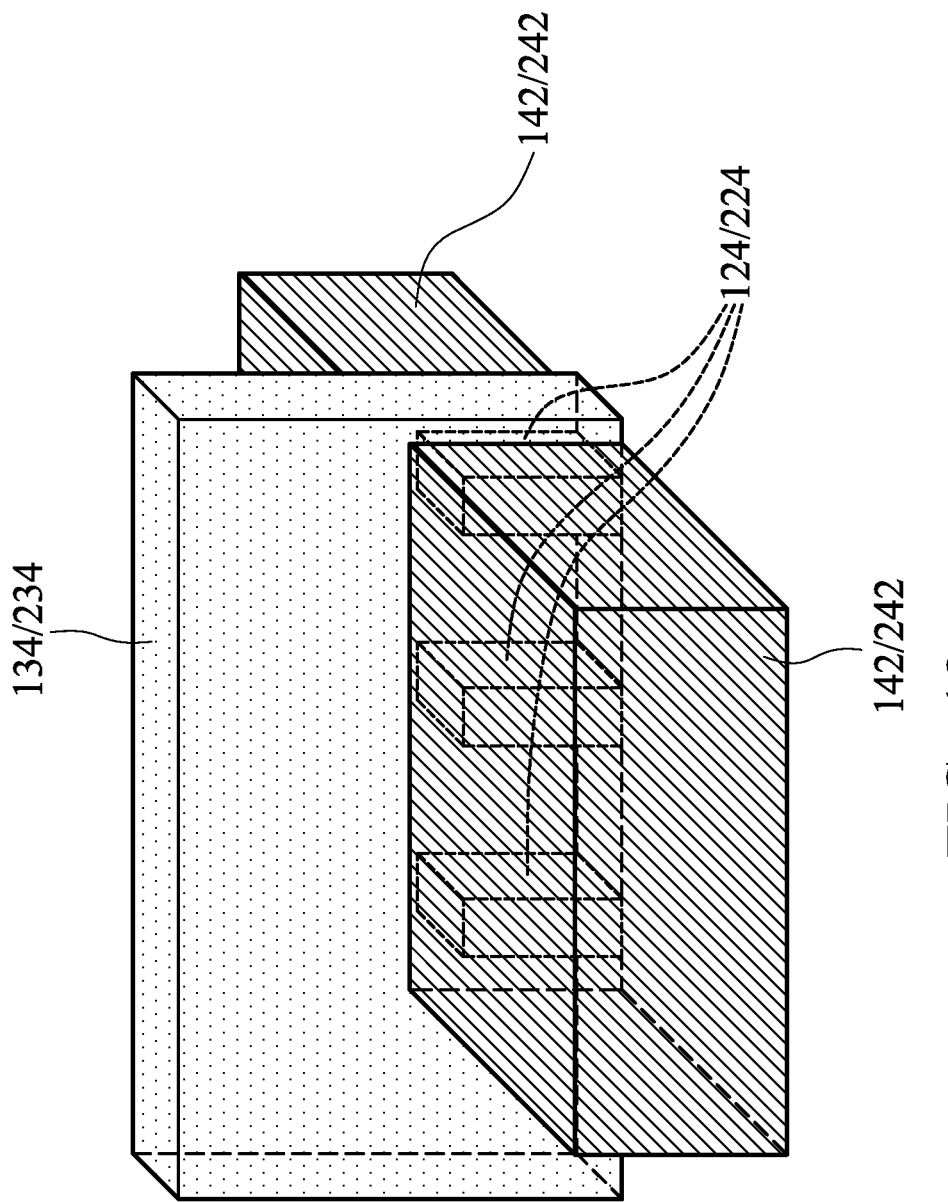

In the above-discussed embodiments, single-fin FinFETs were discussed. Alternatively, the concept of the disclosure may be applied to multi-fin FinFETs. FIGS. 10 through 12 illustrate a cross-sectional view and perspective views of multi-fin FinFETs. Unless specified otherwise, like reference numerals are used to represent like elements. The materials of the elements shown in FIGS. 10-12 are thus not repeated herein. FIG. 10 illustrates a cross sectional view of an integrated circuit including n-type FinFET 150, PMOS FinFET 250, and dummy fin structures 350, including dummy fins 324, which are formed on substrate 320. Substrate 320 may be a germanium substrate or a silicon substrate. N-type FinFET 150 is formed on a p-well, and includes multiple germanium fins 124. Gate electrode 134 is formed over multiple germanium fins 124, so that multiple germanium fins 124 become the fins of a single n-type FinFET 150. Gate dielectrics 132 are formed between germanium fins 124 and gate electrode 134. Similarly, PMOS FinFET 250 is formed on an n-well, and includes multiple germanium fins 224. Gate electrode 234 is formed over multiple germanium fins 224, so that multiple germanium fins 224 become the fins of a single PMOS FinFET 250. Gate dielectrics 232 are formed between germanium fins 124 and gate electrode 134. In addition, dummy fins, which are not used in any FinFETs, are also formed to reduce the pattern-loading effect in the formation of germanium fins 124 and 224.

With multiple fins used in a single FinFET, the drive current of the FinFET can be further increased. Since there is a lattice mismatch between germanium and silicon, it is easier achieve a high quality (with lower defect density) for a germanium epitaxy layer grown from a fin with a smaller fin width than from a fin with a greater fin width.

FIGS. 11 and 12 illustrate perspective views of multiple FinFETs. The like elements in FIG. 11 can be found in FIG. 10. The FinFET may either be n-type FinFET 150 or PMOS FinFET 250, and hence is denoted as 150/250. In FIG. 11, source/drain regions (stressors) 142/242 are grown from germanium fins 124/224, and are discrete regions. In FIG. 12, source/drain regions (stressors) 142/242 grown from germanium fins 124/224 merge with each other.

Figure 13:
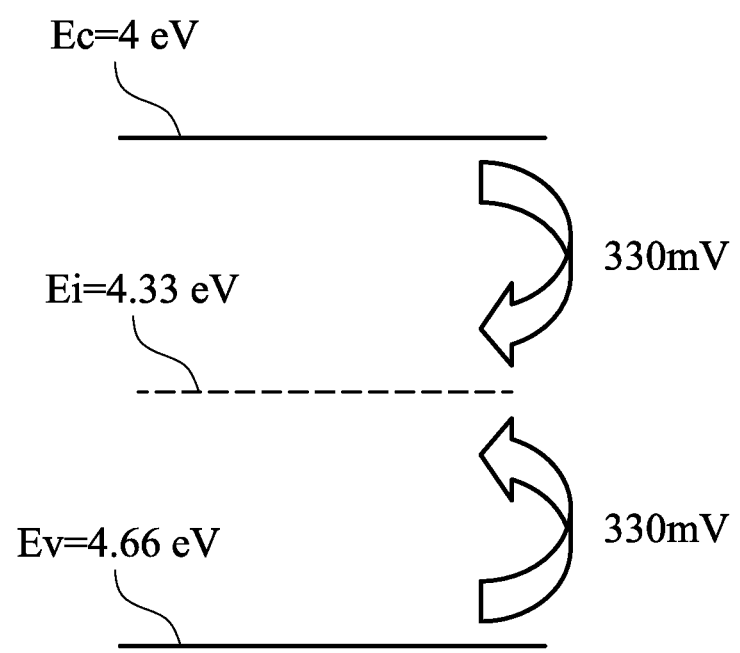
FIG. 13 illustrates the energy bands of germanium.

FIG. 13 illustrates the energy bands of germanium. It is noted that germanium has a conduction band Ec equal to 4 eV, a valence band Ev equal to 4.66 eV, and an intrinsic level Ei (which is (Ec+Ev)/2) equal to 4.33 eV. Therefore, the intrinsic level Ei and the conduction band Ec have an energy difference equal to about 330 mV, and the intrinsic level Ei and the valence band Ev have an energy difference equal to about 330 mV. The 330 mV energy difference may be utilized to simplify the formation of metal gates for n-type germanium FinFETs and p-type germanium FinFETs. Since in germanium FinFETs, the fully depleted channel results in the reduction in threshold voltages Vt, band-edge work functions are no longer needed. Instead, near-mid-bandgap work functions are needed to shift the threshold voltages Vt to target values accurately. Accordingly, for germanium-based FinFETs, with the work functions of metal gates of both n-type germanium FinFETs and p-type germanium FinFETs being close to the intrinsic level of about 4.33 eV, the requirements for optimizing the work functions of n-type FinFETs and p-type FinFETs can both be satisfied, even when a same metallic material is used forming the gates of n-type FinFETs and p-type FinFETs.

In addition to the above-discussed advantageous features, the embodiments of the disclosure have several other advantageous features. By forming germanium-based FinFETs, the drive currents of n-type FinFETs and p-type FinFETs can be improved due to the high electron and hole mobilities of germanium. The leakage currents may also be reduced due to the reduced junction areas of FinFETs compared to planar MOS devices.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a substrate comprising silicon;
shallow trench isolation (STI) regions extending into the substrate;
an n-type fin field effect transistor (FinFET) comprising:
 a first germanium fin over top surfaces of the STI regions;
 a first gate dielectric on a top surface and sidewalls of the first germanium fin;
 a first gate electrode on the first gate dielectric; and
 a source/drain region comprising germanium, with a germanium atomic percentage in the source/drain region being lower than a germanium atomic percentage in the first germanium fin, and the source/drain region extends below the top surfaces of the STI regions to contact the substrate;
a p-type FinFET comprising:
 a second germanium fin over the substrate, wherein the first germanium fin and the second germanium fin are pure germanium fins;
 a second gate dielectric on a top surface and sidewalls of the second germanium fin; and
 a second gate electrode on the second gate dielectric, wherein the first gate electrode and the second gate electrode are formed of a same material having a work function between 4.25 eV and 4.4 eV.

2. The integrated circuit structure of claim 1, wherein the first gate electrode and the second gate electrode are metal gate electrodes.

3. The integrated circuit structure of claim 1, wherein the n-type FinFET further comprises a source/drain region comprising silicon carbon.

4. The integrated circuit structure of claim 1, wherein the p-type FinFET further comprises a source/drain region comprising germanium tin (GeSn).

5. The integrated circuit structure of claim 1 further comprising:
a third germanium fin underlying the first gate electrode, wherein the third germanium fin is physically separated from, and electrically connected to, the first germanium fin; and
a fourth germanium fin underlying the second gate electrode, wherein the fourth germanium fin is physically separated from, and electrically connected to, the second germanium fin.

6. An integrated circuit structure comprising:
a substrate comprising silicon;
shallow trench isolation (STI) regions extending into the substrate;
a p-type fin field effect transistor (FinFET) comprising:
 a first germanium fin over the substrate;
 a first gate dielectric on a top surface and sidewalls of the first germanium fin;
 a first metal gate on the first gate dielectric; and
 a first source/drain region adjacent the first metal gate, wherein the first source/drain comprises a first epitaxial region formed of a semiconductor material different from the first germanium fin; and
an n-type FinFET comprising:
 a second germanium fin over the substrate;

a second gate dielectric on a top surface and sidewalls of the second germanium fin;

a second metal gate on the second gate dielectric, wherein the first metal gate and the second metal gate are formed of a same material; and a second source/drain region adjacent the second metal gate, with the second source/drain region comprising germanium, and a germanium atomic percentage in the second source/drain region being lower than a germanium atomic percentage in the first germanium fin, wherein a bottom surface of the second source/drain region extends below the top surfaces of the STI regions to contact the substrate.

7. The integrated circuit structure of claim 6 wherein the first source/drain region comprises germanium tin (GeSn).

8. The integrated circuit structure of claim 6, wherein the first metal gate and the second metal gate are formed of a same material having a work function between 4.25 eV and 4.4 eV.

9. An integrated circuit structure comprising:
a substrate;
shallow trench isolation (STI) regions extending into the substrate;
a p-type fin field effect transistor (FinFET) comprising:
a first germanium fin over the substrate, wherein the first germanium fin is a germanium fin without being doped with silicon;
a first gate dielectric on a top surface and sidewalls of the first germanium fin;
a first metal gate on the first gate dielectric; and
a first source/drain region adjacent to the first metal gate; and
an n-type FinFET comprising:
a second germanium fin over the substrate, wherein the second germanium fin is a germanium fin without being doped with silicon;
a second gate dielectric on a top surface and sidewalls of the second germanium fin;
a second metal gate on the second gate dielectric; and
a second source/drain region adjacent to the second metal gate, wherein the second source/drain region comprises silicon germanium, with a germanium atomic percentage in the second source/drain region being lower than a germanium atomic percentage in the second germanium fin, wherein the second source/drain region extends below the top surfaces of the STI regions to contact the substrate.

10. The integrated circuit structure of claim 9, wherein the first germanium fin and the second germanium fin are crystal-based germanium fins.

11. The integrated circuit structure of claim 9, wherein the second source/drain region of the n-type FinFET further comprises silicon carbon.

12. The integrated circuit structure of claim 9, wherein the first source/drain region of the p-type FinFET further comprises a group III element and a group V element.

13. The integrated circuit structure of claim 9, wherein the first source/drain region of the p-type FinFET further comprises germanium tin (GeSn).

14. The integrated circuit structure of claim 9, wherein the first metal gate and the second metal gate are formed of a same material having a work function between 4.25 eV and 4.4 eV.

15. The integrated circuit structure of claim 1, wherein the first germanium fin is substantially free from silicon.

16. The integrated circuit structure of claim 15, wherein the source/drain region comprises silicon germanium.

17. The integrated circuit structure of claim 16, wherein the second germanium fin is substantially free from silicon.

18. The integrated circuit structure of claim 17, wherein the second source/drain region comprises silicon germanium.

19. The integrated circuit structure of claim 1, wherein a bottom surface of the first germanium fin is in contact with silicon of the substrate.

* * * * *